United States Patent
Kokubun (10) Patent No.: US 10,782,428 B1
(45) Date of Patent: Sep. 22, 2020

(54) LIGHT RECEIVING DEVICE AND DISTANCE MEASURING APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Koichi Kokubun, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/538,576

(22) Filed: Aug. 12, 2019

(30) Foreign Application Priority Data

Mar. 7, 2019 (JP) ................................. 2019-041874

(51) Int. Cl.
*G01T 1/24* (2006.01)
*H01L 31/107* (2006.01)
(Continued)

(52) U.S. Cl.
CPC .......... *G01T 1/241* (2013.01); *H01L 27/1463* (2013.01); *H01L 31/0224* (2013.01); *H01L 31/107* (2013.01); *G02B 5/26* (2013.01)

(58) Field of Classification Search
None
See application file for complete search history.

(56) References Cited

U.S. PATENT DOCUMENTS 4,686,554 A * 8/1987 Ohmi .................. H01L 31/1105
257/291
9,899,434 B1 * 2/2018 Kokubun .......... H01L 31/02027
(Continued)

FOREIGN PATENT DOCUMENTS

| JP | 2011071455 A | 4/2011 |
| JP | 5385315 B2 | 1/2014 |
| JP | 2018088488 A | 6/2018 |

*Primary Examiner* — Thien F Tran
(74) *Attorney, Agent, or Firm* — Kim & Stewart LLP (57) ABSTRACT

A light receiving device includes a protective layer between first and second electrodes, a first semiconductor layer between the protective layer and the first electrode, the first semiconductor layer having first and second protruding portions, an insulating material between the first and second protruding portions and extending between the protective layer and the first semiconductor layer, a second semiconductor layer between the first protruding portion and the protective layer and between the first protruding portion and the insulating material, a third semiconductor layer between the second semiconductor layer and the protective layer and between the second semiconductor layer and the insulating material, a fourth semiconductor layer between the second protruding portion and the protective layer and between the second protruding portion and the insulating material, and a fifth semiconductor layer between the fourth semiconductor layer and the protective layer and between the fourth semiconductor layer and the insulating material.

20 Claims, 6 Drawing Sheets

(51) Int. Cl.
  *H01L 27/146* (2006.01)
  *H01L 31/0224* (2006.01)
  *G02B 5/26* (2006.01)

(56) References Cited

U.S. PATENT DOCUMENTS

2011/0074283 A1   3/2011   An et al.
2012/0025340 A1   2/2012   Park

\* cited by examiner

SECTION A-A

SECTION B-B

SECTION A3-A3

FIG. 11

SECTION A4-A4

LIGHT RECEIVING DEVICE AND DISTANCE MEASURING APPARATUS

CROSS-REFERENCE TO RELATED APPLICATION

This application is based upon and claims the benefit of priority from Japanese Patent Application No. 2019-041874, filed Mar. 7, 2019, the entire contents of which are incorporated herein by reference.

FIELD

Embodiments described herein relate generally to a light receiving device and a distance measuring apparatus.

BACKGROUND

A light receiving device that has a parallel connection of a quenching resistor and serially connected avalanche photo diodes (APD), which is one type of photoelectric conversion element, and measures the number of incident photons, is known in the art. Such a light receiving device is referred to as a silicon photomultipliers (SiPM) because the APD is made of silicon. In such a light receiving device, it is desired to improve light-receiving sensitivity without increasing the crosstalk between adjacent APDs.

DETAILED DESCRIPTION

Embodiments provide a light receiving device and a distance measuring apparatus that improve light-receiving sensitivity without increasing the crosstalk between adjacent photoelectric conversion elements.

In general, according to one embodiment, a light receiving device includes a first electrode, a second electrode, a protective layer between the first and second electrodes, a first semiconductor layer of a first conductivity type between the protective layer and the first electrode, the first semiconductor layer having a first protruding portion and a second protruding portion, an insulating material spaced from and between the first and second protruding portions and extending between the protective layer and the first semiconductor layer, a second semiconductor layer of the first conductivity type between the first protruding portion and the protective layer and between the first protruding portion and the insulating material, a third semiconductor layer of a second conductivity type between the second semiconductor layer and the protective layer and between the second semiconductor layer and the insulating material, a fourth semiconductor layer of the first conductivity type between the second protruding portion and the protective layer and between the second protruding portion and the insulating material, and a fifth semiconductor layer of the second conductivity type between the fourth semiconductor layer and the protective layer and between the fourth semiconductor layer and the insulating material.

Hereinafter, a light receiving device and a distance measuring apparatus according to embodiments will be described in detail. The present disclosure is not limited by the embodiments. The sectional view of the light receiving device, which is used in the following descriptions of the embodiments, is schematically illustrated. For example, the relation between the thickness and the width of a layer or a ratio between thicknesses of layers is not limited thereto. Dimensions of each component and the number of components in the drawings are schematically illustrated and are not limited thereto.

In the specification, a "Pt type" means that a conductive type is a P-type, and effective impurity concentration is higher than a "P-type". The "effective impurity concentration" refers to the concentration of an impurity contributing to the conductivity of a semiconductor material. When the semiconductor material contains both an impurity as a donor and an impurity as an acceptor, the "effective impurity concentration" refers to the concentration of the impurity excluding the combined amount of the donor and the acceptor.

First Embodiment

Figure 1:
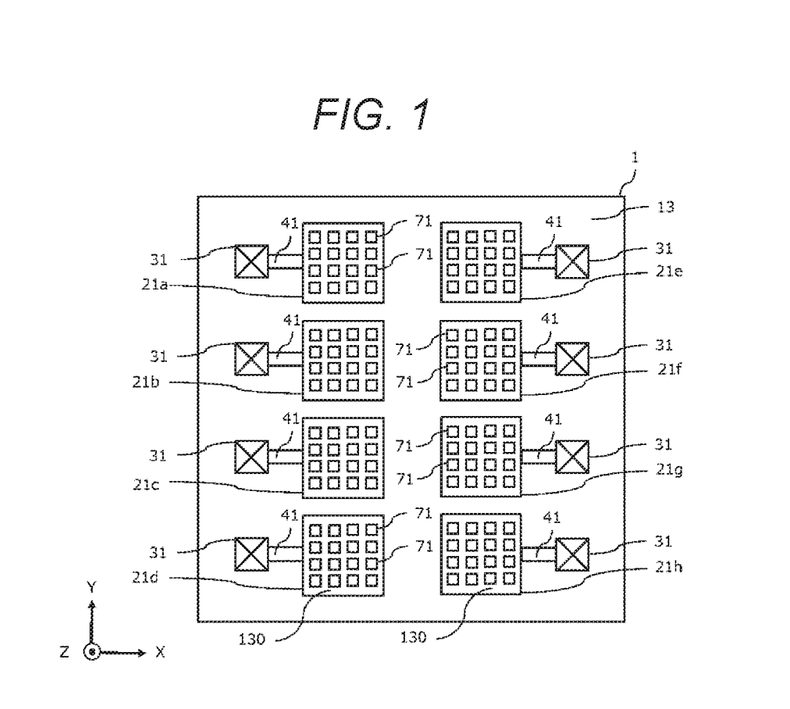
FIG. 1 is a plan view illustrating an example configuration of a light receiving device according to a first embodiment.

FIG. 1 is a plan view illustrating an example of a configuration of a light receiving device 1 according to a first embodiment. In the drawings, one direction is referred to as an X-direction, a direction perpendicular to the X-direction is referred to as a Y-direction, and a direction perpendicular to the X-direction and the Y-direction is referred to as a Z-direction.

The light receiving device 1 includes a plurality of pixels 21. The pixels 21 are planarly arranged in a direction along a silicon substrate 10 described later. The pixel 21 includes a photoelectric conversion element (e.g., APD 71), an isolation element 130, a cathode electrode pad 31, and a cathode wiring 41. FIG. 1 schematically illustrates the arrangement and the number of the pixels 21 and APDs 71, and the present disclosure is not limited thereto.

The photoelectric conversion element generates an electron-hole pair by incident light (e.g., photon). A plurality of photoelectric conversion elements are, for example, avalanche photo diodes (APDs). Here, for easy descriptions, descriptions will be made on the assumption that the photoelectric conversion element is the APD 71. The APDs 71 are planarly arranged in the direction along the silicon substrate 10 described later. Since the APDs 71 have the same rectangular pattern, it is possible to arrange more APDs 71 in a predetermined area.

The isolation element 130 is provided between the APDs 71. The isolation element 130 isolates the APDs 71 from each other to prevent an occurrence of crosstalk between the APDs 71. The crosstalk means that a signal generated when photons are incident on the APD 71 (or pixel 21) influences an adjacent APD 71 (or pixel 21). For example, a silicon oxide film is used as the isolation element 130.

The cathode electrode pad 31 is, for example, a bonding pad which is electrically connected to an external electrode by a bonding wire (not illustrated). The pixel 21 and the cathode electrode pad 31 are electrically connected to each other via the cathode wiring 41.

The pixel isolation film 13 is provided between the pixels 21. The pixel isolation film 13 isolates the pixels 21 from each other to prevent the occurrence of crosstalk between the pixels 21. For example, a silicon oxide film is used as the pixel isolation film 13.

When the APD 71 generates an electron-hole pair by incident photons, the APD 71 outputs a signal. The pixel 21 outputs the signal output by the APD 71 to the cathode electrode pad 31 via the cathode wiring 41.

Figure 2:
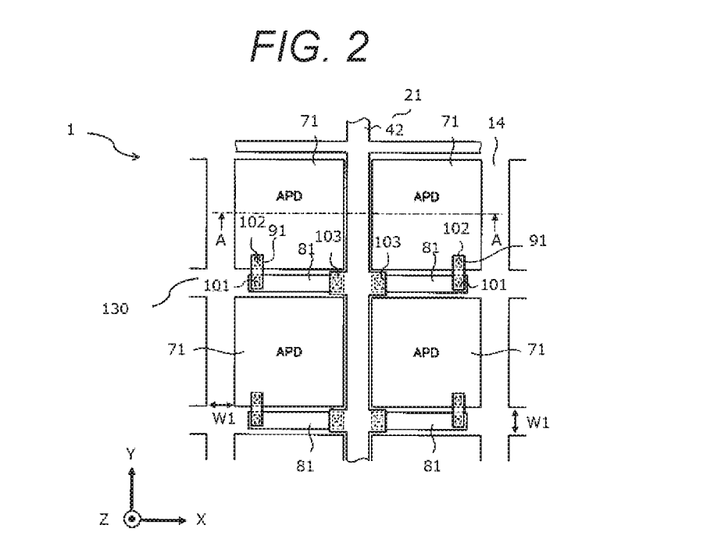
FIG. 2 is a plan view illustrating an example of an APD in the light receiving device of the first embodiment.

FIG. 2 is a plan view illustrating an example of the APD 71 in the light receiving device 1 of the first embodiment.

A protective film 14 is provided on the APD 71 and the isolation element 130. A cathode electrode film 42 and a quenching resistor 81 are provided on the protective film 14 on the isolation element 130. The cathode electrode film 42 is a portion of the cathode wiring 41.

The resistance value of the quenching resistor 81 is several hundred kΩ, for example. The quenching resistor 81 is made of polycrystalline silicon, for example.

The cathode electrode film 42 is connected to one end of the quenching resistor 81 via a connection portion 103. The other end of the quenching resistor 81 is connected to one end portion of a wiring 91. The other end portion of the wiring 91 is connected to a connection portion 102 such as a via, which reaches an N-type epitaxial layer 163 described later. The via is made of a metal material, for example. The via penetrates the protective film 14 to be connected to the N-type epitaxial layer 163.

Figure 3:
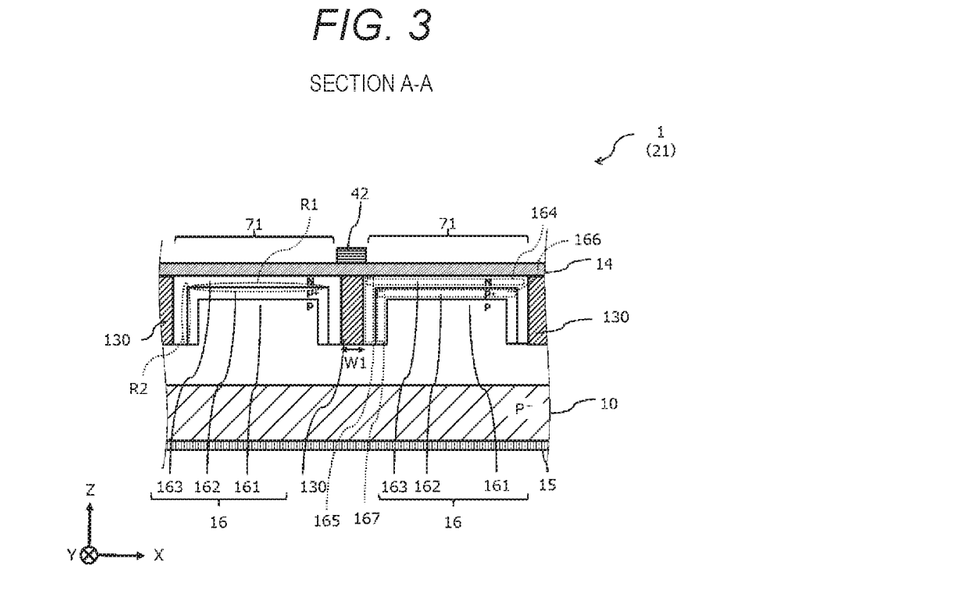
FIG. 3 is a sectional view illustrating the light receiving device of the first embodiment.

FIG. 3 illustrates an example of a sectional structure of the light receiving device 1 of the first embodiment and is a sectional view taken along line A-A in FIG. 2.

The APD 71 includes the cathode electrode film 42, the protective film 14, the isolation element 130, an Si epitaxial layer 16, the silicon substrate 10, and a metal film 15. The Si epitaxial layer 16 is provided on the silicon substrate 10 and includes a P-type epitaxial layer 161, a P+ type epitaxial layer 162, and the N-type epitaxial layer 163.

The P-type epitaxial layer 161, the P+ type epitaxial layer 162, and the silicon substrate 10 have a conductive type of a P-type. The N-type epitaxial layer 163 has a conductive type of an N-type. The P-type impurity concentration of the P+ type epitaxial layer 162 is higher than the P-type impurity concentration of the P-type epitaxial layer 161. The P-type impurity concentration of the P-type epitaxial layer 161 is higher than the P-type impurity concentration of the silicon substrate 10. The P-type impurity concentration of the P-type epitaxial layer 161 is, for example, on the order of $10^{15}/cm^3$. The P-type impurity concentration of the P+ type epitaxial layer 162 is on the order of $10^{16}/cm^3$. The N-type impurity concentration of the N-type epitaxial layer 163 is on the order of $10^{20}/cm^3$.

The metal film 15 is provided on a surface of the silicon substrate 10 on an opposite side of a surface thereof on which the Si epitaxial layer 16 is provided. The protective film 14 is provided on the Si epitaxial layer 16. The isolation element 130 is provided between the protective film 14 and the Si epitaxial layer 16.

For example, a single crystal substrate may be used as the silicon substrate 10.

The metal film 15 has a function as a reflective film that reflects photons which are incident into the APD 71, but pass through the APD 71 without causing generation of an electron-hole pair. Since the electron-hole pair can also be generated by the photons reflected by the metal film 15, the sensitivity of the APD 71 is improved. The metal film 15 has a function as a common electrode between the APDs 71. For example, aluminum, copper, gold or the like is used for the metal film 15. In the first embodiment, the common metal film 15 is provided for the APDs 71, and this is advantageous in terms of manufacturability in comparison to a light receiving device in which the metal film is provided for each APD 71.

For example, a silicon oxide film is used as the protective film 14.

The isolation element 130 extends from a position of being in contact with the protective film 14 in a direction toward the metal film 15. With the isolation element 130, regarding a thickness from an interface with the silicon substrate 10 in the Z-direction, a thick portion and a thin portion are formed in the Si epitaxial layer 16.

The isolation element 130 isolates the adjacent APDs 71 from each other. The isolation element 130 prevents leakage of carriers in one APD 71 to other adjacent ADP 71, and prevent the occurrence of crosstalk. A distance between the adjacent APDs 71, that is, the width W1 of the isolation element 130 may be such a distance that electrons and holes generated in the APD 71 are attenuated and thus do not reach the adjacent APD 71. In this specification, the width refers to a length of each component in a substrate in-plane direction (in an XY plane).

The isolation elements 130 illustrated in FIG. 3 are joined in a grid shape so as to surround the APD 71 as illustrated in FIG. 1. The shape of the isolation elements 130 is not limited to the grid shape and may be appropriately changed with matching with the shape of the APD 71 so as to surround the APD 71. The P-type epitaxial layer 161 is in contact with the silicon substrate 10. The P-type epitaxial layer 161 has a protrusion portion that extends from a position at which an end of the isolation element 130 on the metal film 15 side is in contact with the P-type epitaxial layer 161, in a direction toward the protective film 14.

The N-type epitaxial layer 163 is provided between the protective film 14 and the P-type epitaxial layer 161. The N-type epitaxial layer 163 is surrounded by the isolation elements 130 to be isolated from the N-type epitaxial layer 163 of the adjacent APD 71. The N-type epitaxial layer 163 has a first portion 164 and a second portion 165. The first portion 164 is provided along the protective film 14. The second portion 165 is provided along a side wall of the isolation element 130 in a direction from the protective film 14 toward the metal film 15.

The P+ type epitaxial layer 162 is surrounded by the isolation elements 130 to be isolated from the P+ type epitaxial layer 162 and the N-type epitaxial layer 163 of the adjacent APD 71. The P+ type epitaxial layer 162 has a third portion 166 provided along the first portion 164, between the first portion 164 of the N-type epitaxial layer 163 and the protrusion portion of the P-type epitaxial layer 161. The P+ type epitaxial layer 162 has a fourth portion 167 provided along the second portion 165, between the second portion 165 of the N-type epitaxial layer 163 and the protrusion portion of the P-type epitaxial layer 161. Impurities may be contained in the third portion 166 and the fourth portion 167 at the same concentration or different concentrations. The concentration at a portion at which the first portion 164 and the second portion 165 intersect each other may be equal to the impurity concentration of either the first portion 164 or the second portion 165.

A PN junction layer is formed at a portion at which the N-type epitaxial layer 163 is in contact with the $P^+$ type epitaxial layer 162. The PN junction layer is surrounded by the isolation elements 130 so as to be isolated from the PN junction layer of the adjacent APD 71. The PN junction layer has an R1 portion and an R2 portion. The R1 portion is configured with the first portion 164 and the third portion 166 and extends along the protective film 14. The R2 portion is configured with the second portion 165 and the fourth portion 167 and extends along the side wall of the isolation element 130 in the direction from the protective film 14 toward the metal film 15.

The operation of the APD 71 will be described. The APD 71 operates in the Geiger mode. In the Geiger mode, a reverse bias voltage which is higher than the breakdown voltage of the APD 71 is applied to a cathode (e.g., N-type epitaxial layer 163) and an anode (e.g., silicon substrate 10), and thus a high electric field is formed in the PN junction layer of the APD 71. An electron-hole pair is generated in the PN junction layer by photons injected to the APD 71. In the electron-hole pair, with the electric field, the electron drifts to the N-type epitaxial layer 163 side, and the hole drifts to the silicon substrate 10 side. If carriers having large energy collide with crystal lattice, ionization occurs to generate a new electron-hole pair. A discharge phenomenon in which the ionization occurs in sequence refers to Geiger discharge.

If the Geiger discharge occurs in the APD 71, the number of carriers is amplified by sequential ionization, but the amplification has an upper limit by the intensity of the electric field. Therefore, if the Geiger discharge occurs, a constant saturation output depending on the intensity of the electric field is generated regardless of the quantity of light. Since the Geiger discharge is terminated by the quenching resistor 81, the APD 71 outputs a pulse of an output current.

The quenching resistor 81 causes voltage drop when the output current of the APD 71 flows, and decreases an operation voltage of the APD 71. The Geiger discharge is stopped by decreasing the operation voltage of the APD 71. When the Geiger discharge occurs, the Geiger discharge is stopped by the quenching resistor 81, and thereby it is possible to detect the next photon.

Figure 4:
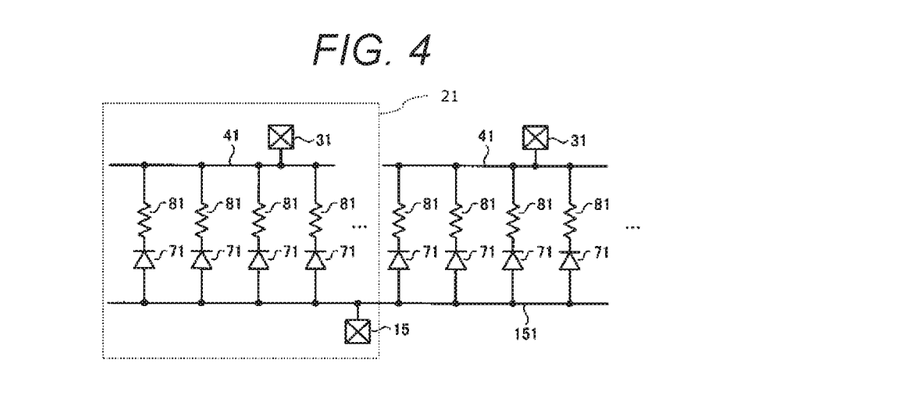
FIG. 4 is a diagram illustrating an equivalent circuit of a portion of the light receiving device of the first embodiment.

FIG. 4 is a diagram illustrating an equivalent circuit of a portion of the light receiving device 1 of the first embodiment. The anode (e.g., silicon substrate 10) of each APD 71 is connected to the metal film 15. The APD 71 provided in a different pixel 21 is also connected to the same metal film 15. The metal film 15 functions as an anode electrode.

The cathode (e.g., N-type epitaxial layer 163) of the APD 71 in each pixel 21 is connected to the cathode wiring 41 provided in each pixel 21 via the quenching resistor 81. The cathode wiring 41 is electrically connected to the cathode electrode pad 31.

Figure 5:
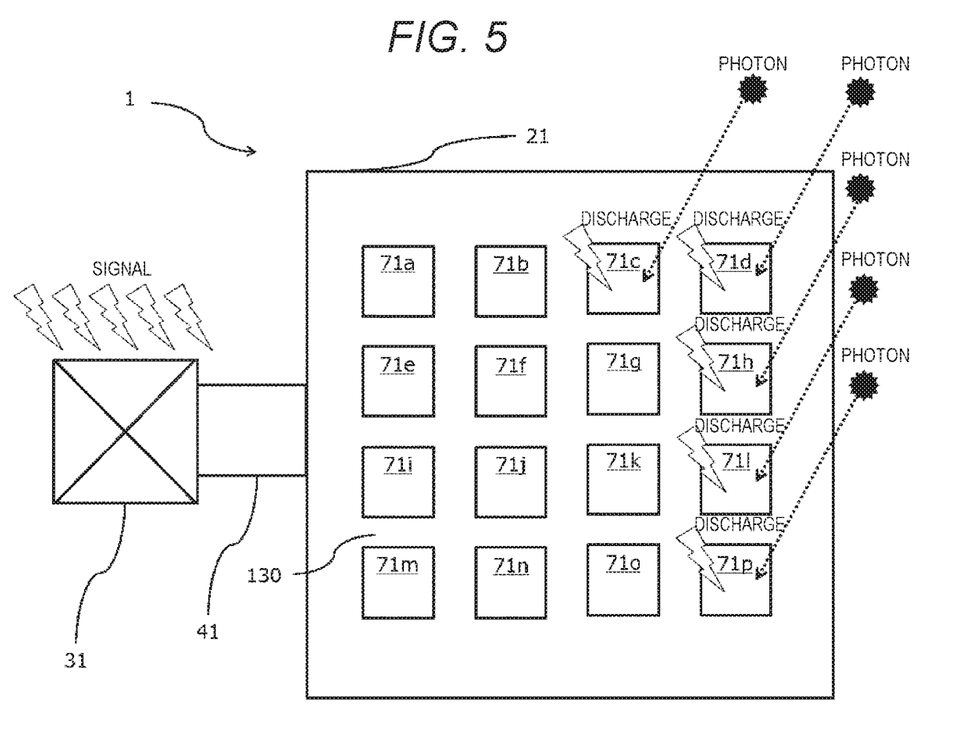
FIG. 5 is a plan view illustrating an example of a pixel in the light receiving device of the first embodiment.

FIG. 5 is a plan view illustrating an example of the pixel 21 in the light receiving device 1. In FIG. 5, the pixel 21 includes 16 APDs 71a to 71p. A series connection of each of the APDs 71a to 71p and the quenching resistor 81 is connected in parallel between the cathode electrode pad 31 and the metal film 15.

Each of the APDs 71a to 71p in the pixel 21 outputs the pulse of the same output current when each of the APDs 71a to 71p detects a photon. Signals output by the APD 71a to 71p are integrated for each pixel 21, and the integrated signal is output to the cathode electrode pad 31. For example, when five photons are incident on and detected by the APDs 71c, 71d, 71h, 71l, and 71p in the pixel 21 in FIG. 1, respectively, a signal obtained by superimposing five pulses generated by the Geiger discharge is output from the cathode electrode pad 31 of the pixel 21.

That is, each APD 71 detects that the photon is incident, according to the Geiger discharge. The pixel 21 outputs a signal depending on the quantity of the incident light, based on the number of APDs 71 detecting photons. Even though a plurality of photons are incident on the same APD 71, and each of the photons generates an electron-hole pair, a constant saturation output depending on the intensity of the electric field is generated from the APD 71. Therefore, the output current when a plurality of photons are incident on the same APD 71, and electron-hole pairs are generated is equal to the output current when one photon is incident on the same APD 71, and an electron-hole pair is generated.

Figure 6:
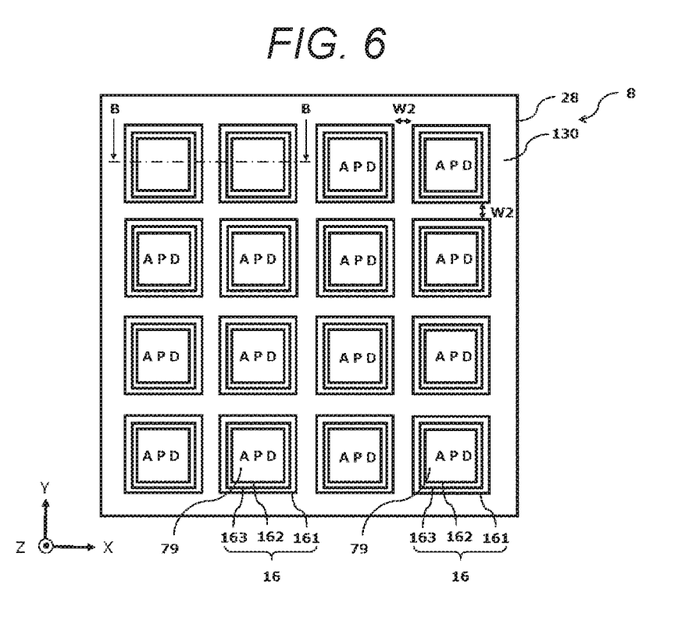
FIG. 6 is a plan view illustrating an example of a pixel in a light receiving device of a first comparative example.
Figure 7:
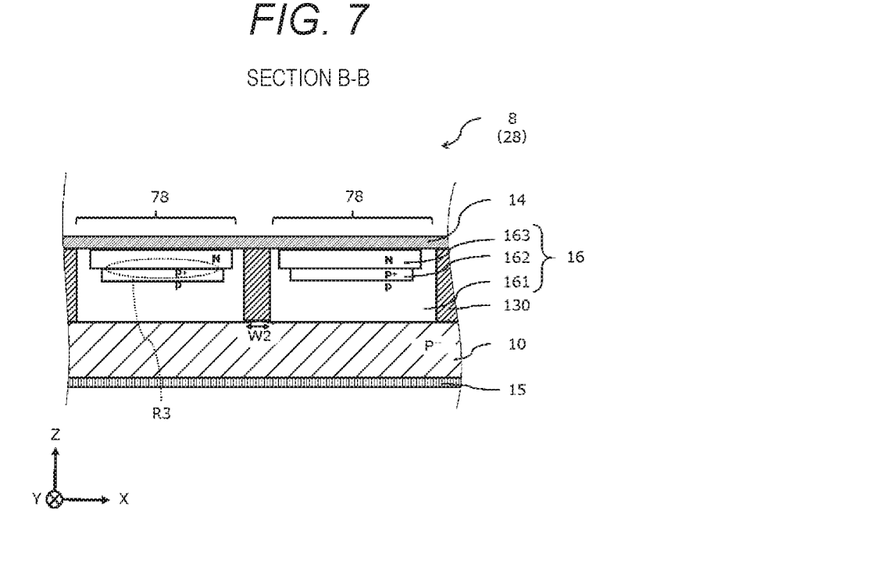
FIG. 7 is a sectional view illustrating the light receiving device of the first comparative example.

FIG. 6 is a plan view illustrating an example of a pixel in a light receiving device 8 according to a first comparative example. The pixel 28 includes a plurality of APDs 78. FIG. 7 illustrates an example of a sectional structure of the light receiving device 8 of the first comparative example and is a sectional view taken along line B-B in FIG. 6. FIGS. 6 and 7 illustrate a structure of the components of the Si epitaxial layer 16 with illustrations of the quenching resistor 81, the cathode electrode film 42, and the like, omitted.

As illustrated in FIG. 7, in the first comparative example, the isolation element 130 made of a silicon oxide film or the like is provided on the p-type silicon substrate 10. Each APD 78 includes the Si epitaxial layer 16 at a position between the protective film 14 and the silicon substrate 10. The Si epitaxial layer 16 includes the P-type epitaxial layer 161, the $P^+$ type epitaxial layer 162, and the N-type epitaxial layer 163. The P-type epitaxial layer 161 is provided between the protective film 14 and the silicon substrate 10. The $P^+$ type epitaxial layer 162 is provided between the protective film 14 and the P-type epitaxial layer 161. The N-type epitaxial layer 163 is provided between the protective film 14 and the $P^+$ type epitaxial layer 162. The size of the $P^+$ type epitaxial layer 162 in a direction parallel to the protective film 14, that is, the area of the $P^+$ type epitaxial layer 162 in the XY plane is smaller than the N-type epitaxial layer 163. In other words, in a plan view from the Z-direction, the N-type epitaxial layer 163 includes the $P^+$ type epitaxial layer 162 therein. A PN junction layer R3 is formed on a contact surface between the $P^+$ type epitaxial layer 162 and the N-type epitaxial layer 163. The PN junction layer R3 is wide only in the direction along the protective film 14 (substrate in-plane direction).

Generally, the light receiving device is desired to have a high signal-to-noise ratio (SN ratio). In the first comparative example of the light receiving device 8, the ratio (aperture ratio) of the APD 78 to the area of the pixel 28 is increased, and a light receiving area (area of the PN junction layer) is increased, in order to improve light-receiving sensitivity. The light receiving area is increased by enlarging the $P^+$ type epitaxial layer 162 in the substrate in-plane direction (in the XY plane). However, if the light receiving area is increased by enlarging the $P^+$ type epitaxial layer 162, the distance between the adjacent APDs 78, that is, the width W2 of the isolation element 130 disposed between the APDs 78 is small when the area of the pixel 28 is not changed. If the width W2 of the isolation element 130 is small, when electron-hole pairs are generated in one APD 78, electrons and holes enter into other adjacent APD 78. That is, crosstalk of detecting electrons and holes occurs in an APD 78 which is adjacent to another APD 78 in which electron-hole pairs are generated, and thus noise increases. As a result, by only increasing the aperture ratio, it is not possible to increase the SN ratio although it is possible to improve light-receiving sensitivity. As described above, in the light receiving device 8 of the first comparative example, it is difficult to increase the light receiving area and to reduce noise, without changing the area of the pixel 28.

As a simple comparison, a case where the areas of the pixel, the widths of the isolation element 130, and the areas of the APD in the substrate in-plane direction (in the XY plane) in the first comparative example and the embodiment are equal to each other is considered. The area of the R1 portion corresponding to the PN junction layer (PN junction layer formed along the protective film) on the substrate surface in the first embodiment is equal to the area of the PN junction layer R3 in the first comparative example. In addition, in the first embodiment, the PN junction layer corresponding to the R2 portion is provided along the isolation element 130. Therefore, the area of the effective PN junction layer in the first embodiment is larger than that in the first comparative example. The light receiving device 1 which includes the PN junction layer having a wide area in the first embodiment has light-receiving sensitivity higher than that of the light receiving device 8 of the first comparative example.

Figure 8:
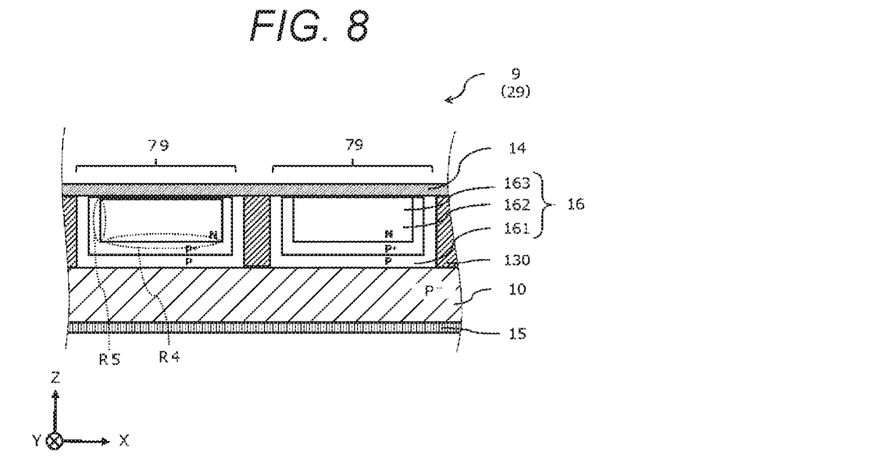
FIG. 8 is a sectional view illustrating a light receiving device of a second comparative example.

FIG. 8 illustrates an example of a sectional structure of a light receiving device 9 according to a second comparative example. FIG. 8 illustrates a structure of the components of the Si epitaxial layer 16 with illustrations of the quenching resistor 81, the cathode electrode film 42, and the like, omitted. In an APD 79 of the second comparative example, the N-type epitaxial layer 163 is provided in a range of a predetermined depth from the protective film 14, and the P+ type epitaxial layer 162 is provided in the P-type epitaxial layer 161 to surround the side surface and the lower surface of the N-type epitaxial layer 163. The PN junction layer has an R4 portion provided in the substrate in-plane direction and an R5 portion provided in a direction along the isolation element 130. The area of the PN junction layer in the second comparative example is not different from the area of the PN junction layer in the first embodiment. However, in the structure in the second comparative example, if the area of the R5 portion which corresponds to the PN junction layer and is provided along the isolation element 130 increases, a distance between the R4 portion (corresponding to the PN junction layer) in the substrate in-plane direction and the light receiving surface becomes long, and the thickness of the N-type epitaxial layer 163 increases. Photons are incident on the surface of the protective film 14 on the opposite side of the Si epitaxial layer 16 in the APD 79. Thus, if thicknesses of the P+ type epitaxial layer 162 and the N-type epitaxial layer 163 and the distance between a PN junction surface and the light receiving surface increase, efficiency of the incident photons forming electron-hole pairs decreases.

On the contrary, in the first embodiment, even though the area of PN junction in the R2 portion is increased in order to increase the area of the PN junction layer, the thicknesses of the P+ type epitaxial layer 162 and the N-type epitaxial layer 163 at the R1 portion and the distance between the PN junction surface of the R1 portion and the light receiving surface is not influenced. Therefore, PN junction in the R1 portion can be optimally designed according to the purpose regardless of the presence of the PN junction in the R2 portion.

The impurity concentration or the thicknesses of the R1 portion and the R2 portion in the first embodiment can be separately adjusted. Therefore, for example, the PN junction layer in the R1 portion and the PN junction layer in the R2 portion can have characteristics different from each other.

As described above, in the light receiving device 1 of the first embodiment, the area of the PN junction layer formed by the APD 71 is large, and thus it is possible to improve light-receiving sensitivity. In the light receiving device 1 of the first embodiment, even though the area of the pixel 21 is not large, the area of the PN junction layer can be increased while the adjacent APDs 71 has an appropriate distance therebetween. Thus, it is possible to avoid an increase of noise by the crosstalk.

Second Embodiment

Figure 9A:
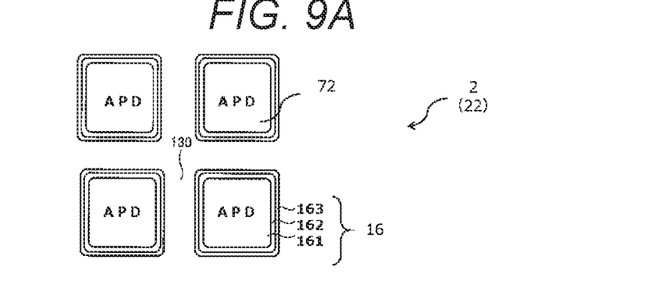
FIGS. 9A and 9B are plan views schematically illustrating a portion of a pixel in a light receiving device according to a second embodiment.
Figure 9B:
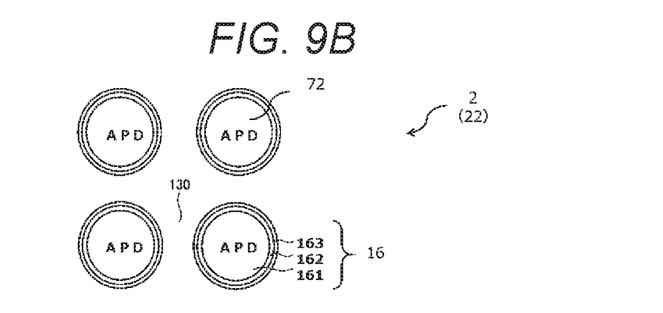

A second embodiment is different from the first embodiment in a point of the form of an APD 72 in a plan view.

FIGS. 9A and 9B are plan views schematically illustrating a portion of a pixel 22 in a light receiving device 2 according to the second embodiment. The pixel 22 in the light receiving device 2 includes the APD 72. In FIG. 9A, any of the P-type epitaxial layer 161, the P+ type epitaxial layer 162, and the N-type epitaxial layer 163 has a rectangular shape having rounded corners. In FIG. 9B, any of the P-type epitaxial layer 161, the P+ type epitaxial layer 162, and the N-type epitaxial layer 163 has a circular shape. In addition to the shapes illustrated in FIGS. 9A and 9B, the P-type epitaxial layer 161, the P+ type epitaxial layer 162, and the N-type epitaxial layer 163 may have an elliptical shape or a polygonal shape having rounded corners. The term "rounded" includes a polygonal shape in which the number of corners is large, and the respective sides are substantially connected smoothly. Other components are similar to those in the first embodiment, and thus descriptions thereof will not be repeated.

As in the first embodiment, in a case where the shape of the APD 72 in a plan view is rectangular, the electric field is concentrated on the corners. However, in the second embodiment, the shape of the Si epitaxial layer 16 is a rectangular shape having rounded corners, a circular shape, or an elliptical shape. Thus, achieved is an effect that it is possible to prevent electric field concentration in comparison to the first embodiment, in addition to the effects in the first embodiment.

Third Embodiment

Figure 10:
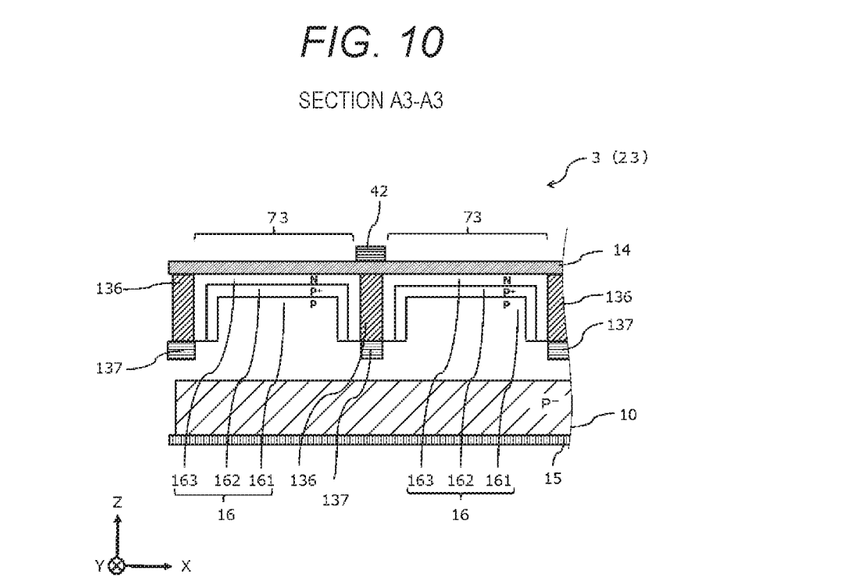
FIG. 10 is a sectional view illustrating a light receiving device according to a third embodiment.

A third embodiment is different from the first embodiment in that the isolation element on the metal film 15 side includes a material different from a material in the isolation element on the protective film 14 side.

FIG. 10 is a sectional view illustrating an example of a sectional structure of a light receiving device 3 of the third embodiment and corresponds to the sectional view taken along line A-A in FIG. 2. A pixel 23 in the light receiving device 3 includes an APD 73. In the third embodiment, the isolation element that isolates APDs 73 from each other is configured with an isolation element 136 on the protective film side and an isolation element 137 on the metal film side. The isolation element 136 on the protective film side and the isolation element 137 on the metal film side are provided between the protective film 14 and the Si epitaxial layer 16.

The isolation element 136 on the protective film side extends from a position of being in contact with the protective film 14 in the direction toward the metal film 15. The length of the isolation element 136 on the protective film side in the Z-direction may be substantially equal to the length of the isolation element 130 in the Z-direction in the first embodiment. The isolation element 136 on the protective film side includes an insulating material including N-type impurities.

The isolation element 137 on the metal film side is provided on the metal film 15 side of the isolation element 136 on the protective film side and extends from a position of being in contact with the isolation element 136 on the protective film side in the direction toward the metal film 15. Any of an insulating material which does not contain impurities, an insulating material in which P-type impurities are contained in the isolation element 136 on the protective film side, and an insulating material containing N-type impurities at concentration different from that of the isolation element 136 on the protective film side may be used for the isolation element 137 on the metal film side. The insulating material is silicon oxide, for example.

In the third embodiment, the isolation element 137 on the metal film side, which is provided closer to the metal film 15 than the PN junction layer isolates the APDs 73 from each other, and thereby electrons and holes generated from the PN junction layer are separated from each other between the adjacent APDs 73. Thus, it is possible to prevent the occurrence of crosstalk more than that in the first embodiment.

Other components are similar to those in the first embodiment, and thus descriptions thereof will not be repeated.

Fourth Embodiment

Figure 11:
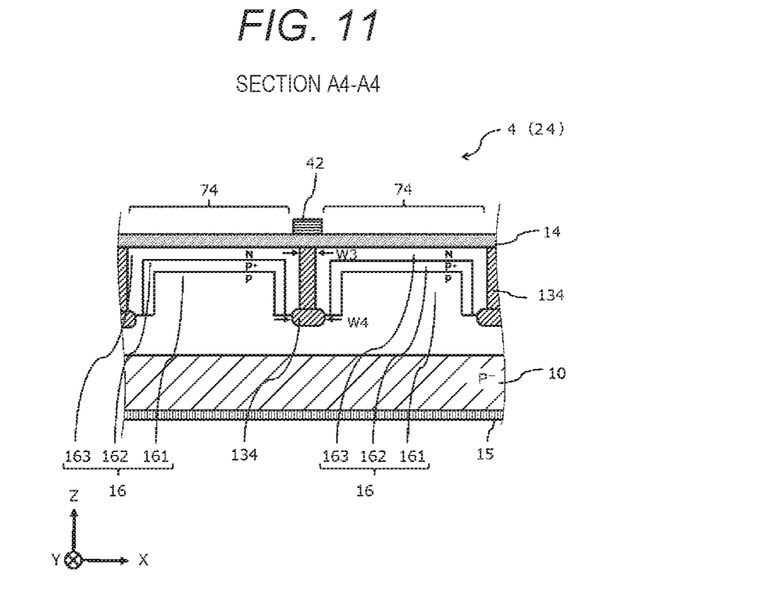
FIG. 11 is a sectional view illustrating a light receiving device according to a fourth embodiment.

A fourth embodiment is different from the first embodiment in a point of the shape of the isolation element 134 that isolates APDs 74.

FIG. 11 is a sectional view illustrating an example of a sectional structure of a light receiving device 4 according to the fourth embodiment and corresponds to a section at the position of the line A-A in FIG. 2. A pixel 24 in the light receiving device 4 includes an APD 74.

As illustrated in FIG. 11, in the isolation element 134, the width at the position of being in contact with the protective film 14 is set as W3, and the width at a position closer to the vicinity of the end portion on the metal film 15 than the position of being in contact with the protective film 14 is set as W4. The width W4 is wider than the width W3, that is, W3<W4 is satisfied.

A portion thinner than the width W3 or a portion thicker than the width W4 may be provided between the portion having a width W3 and the portion having a width W4 in the isolation element 134. The width W3 may be defined not by the width at the position at which the isolation element 134 is in contact with the protective film 14, but by the width of the isolation element 134 at an intermediate position in the Z-direction.

The size of the width W3 at the position at which the isolation element 134 is in contact with the protective film 14 is correlated with the area in which the APD 74 can receive light from the outside of the device.

In the fourth embodiment, the isolation element 134 satisfying W3<W4 is provided, and the width W3 is made narrow. Thus, even though the area of the pixel 24 is not increased, it is possible to increase the area in which the APD 74 can receive light from the outside of the device and to improve the light-receiving sensitivity of the APD 74. Since the width W4 is thick, it is possible to isolate the adjacent APDs 74 from each other and to prevent the occurrence of crosstalk.

Other components are similar to those in the first embodiment, and thus descriptions thereof will not be repeated.

Use Example

Figure 12:
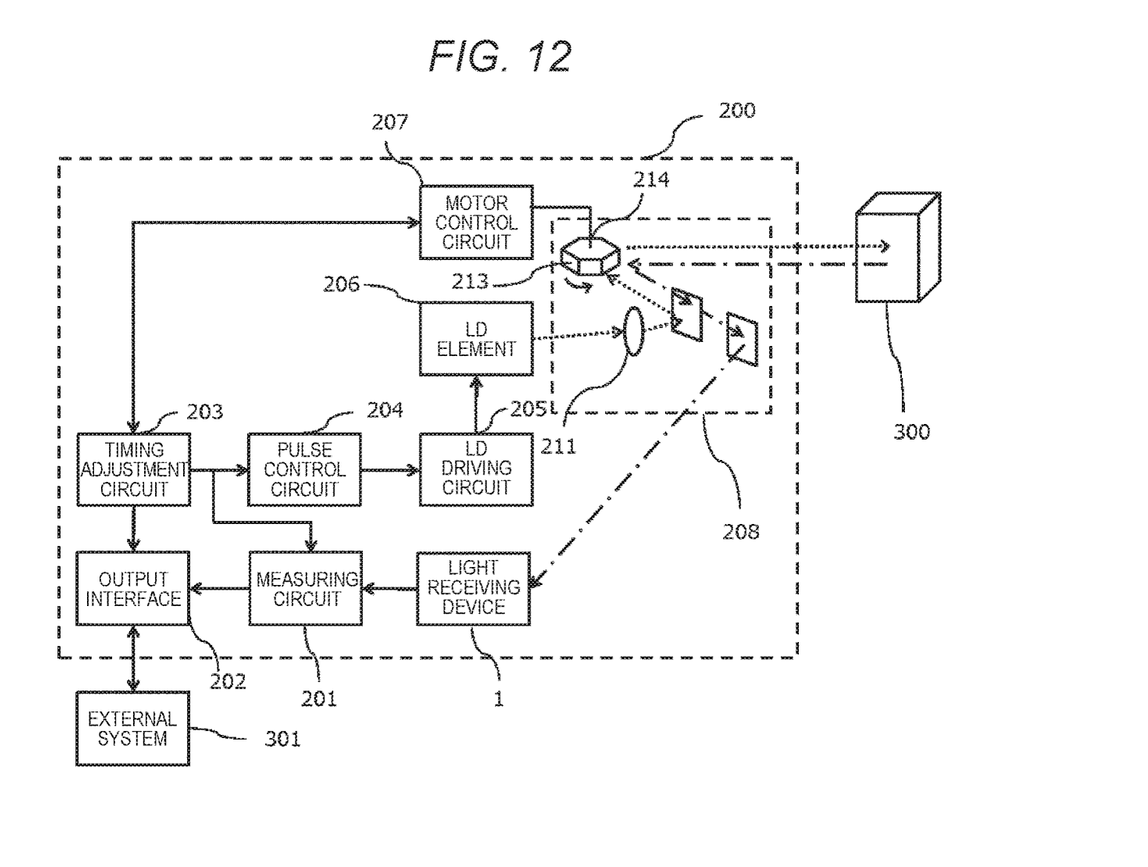
FIG. 12 is a block diagram illustrating an example of a configuration of a distance measuring apparatus that incorporates the light receiving device according to the embodiments.

The light receiving device 1 may be used in a distance measuring apparatus. FIG. 12 is a block diagram illustrating an example of a configuration of a distance measuring apparatus 200 that incorporates the light receiving device 1.

The distance measuring apparatus 200 is a light detection and ranging (LIDAR) device. The LIDAR device emits a pulse of laser light, measures the time until the light is reflected back, and measures the distance to a point in which the light is reflected. The LIDAR device is not only used as a distance measuring unit. The LIDAR device emits light in various directions, and thus can be used for digital imaging methods using information such as an emission direction, the distance to the reflection point, and the intensity of the reflected light. The distance measuring apparatus 200 may be mounted on a car or a drone.

The distance measuring apparatus 200 includes the light receiving device 1 of the first embodiment, a measuring circuit 201, an output interface 202, a timing adjustment circuit 203, a pulse control circuit 204, a laser diode driving circuit (LD driving circuit) 205, a laser diode element (LD element) 206, a motor control circuit 207, and an optical device 208. Any of the light receiving devices 1, 2, 3, 4 can be used in the distance measuring apparatus 200.

An example of an operation of the distance measuring apparatus 200 will be described.

The timing adjustment circuit 203 adjusts a direction for emitting the laser pulse and a timing of light emission, and provides timing information to the measuring circuit 201 and the output interface 202. The pulse control circuit 204 transmits a command to the LD driving circuit 205 based on the timing adjusted by the timing adjustment circuit 203 such that the LD driving circuit 205 outputs output light in a form of a pulse. The LD driving circuit 205 applies a current proper for outputting the set pulse, to the LD element 206, and thus the LD element 206 emits light. The motor control circuit 207 controls an operation of a motor 214 in the optical device 208 based on the timing information given by the timing adjustment circuit 203 such that the output light of the LD element 206 is emitted at the timing in an appropriate direction. The optical device 208 includes a lens 211, a mirror 213, and the motor 214. The optical device 208 collimates the output light emitted from the LD element 206 and emits the collimated light in the appropriate direction. The mirror 213 is attached to the motor 214. If the motor 214 operates, the angle of the mirror 213 changes, and an angle at which the output light is incident on and reflected by the mirror 213 changes. In this manner, an emission direction of the output light is adjusted. An emission angle refers to an angle formed by a direction in which the output light is emitted from the distance measuring apparatus 200 and a predetermined reference direction.

The optical device 208 receives reflected light obtained in a manner that the output light abuts against a distance measurement target point 300 and then is reflected, and transmits the reflected light to the light receiving device 1. The light receiving device 1 detects the reflected light and transmits an electrical signal having a value depending on the number of photons in the reflected light, to the measuring circuit 201. The measuring circuit 201 measures the emission angle of the output light and time from emission of the output light to detection of the reflected light, and measures a distance from the distance measuring apparatus 200 to the distance measurement target point 300, based on the timing information given from the timing adjustment circuit 203. The output interface 202 outputs information obtained by measurement of the measuring circuit 201 to the outside of the distance measuring apparatus 200, for example, to a computer capable of performing image processing.

The distance measuring apparatus 200 uses the light receiving device which has high light-receiving sensitivity, has small noise occurring by crosstalk, and is described in the above embodiment. Thus, the distance measuring apparatus 200 can be used for a distance measurement method or a digital image method which is more accurate than that in the related art.

The light receiving devices 1, 2, 3, and 4 in the above embodiments can be used for various applications for detecting light.

For example, the light receiving devices 1, 2, 3, and 4 of the embodiments may be used to perform photon counting. The light receiving device 1 can be used for the following applications: medical diagnostic devices (PET, CT, gamma camera, and the like); industrial equipment (baggage (X-ray) inspection equipment, food inspection equipment, industrial (IC) measurement equipment, laser scanner, and the like); the biotechnology field (fluorescence analysis devices, flow cytometry, DNA inspection devices, and the like); various spectroscopic analysis fields; and environmental analysis (oil exploration, radiation detection, and the like). The light receiving device 1 may be used instead of a photomultiplier tube (PMT).

For example, the light receiving devices 1, 2, 3, and of the embodiments may be used for infrared distance measurement and various sensor applications. The light receiving devices 1, 2, 3, and 4 can be used for a proximity sensor, Auto Focus, gesture control, a home door, a people counting device, a security device, for example. The LIDAR system incorporating the light receiving device 1 can be mounted in a car and can be used for automatic control of a vehicle speed or a brake system in accordance with traffic conditions, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light receiving device comprising:
    a first electrode;
    a second electrode;
    a protective layer between the first and second electrodes;
    a first semiconductor layer of a first conductivity type between the protective layer and the first electrode, the first semiconductor layer having a first protruding portion and a second protruding portion;
    an insulating material spaced from and between the first and second protruding portions and extending between the protective layer and the first semiconductor layer;
    a second semiconductor layer of the first conductivity type between the first protruding portion and the protective layer and between the first protruding portion and the insulating material;
    a third semiconductor layer of a second conductivity type between the second semiconductor layer and the protective layer and between the second semiconductor layer and the insulating material;
    a fourth semiconductor layer of the first conductivity type between the second protruding portion and the protective layer and between the second protruding portion and the insulating material; and
    a fifth semiconductor layer of the second conductivity type between the fourth semiconductor layer and the protective layer and between the fourth semiconductor layer and the insulating material.

2. The light receiving device according to claim 1, further comprising:
    a resistor which is electrically connected to the second electrode.

3. The light receiving device according to claim 2, wherein the second semiconductor layer and the third semiconductor layer have a rectangular shape having rounded corners in a plan view.

4. The light receiving device according to claim 2, wherein the second semiconductor layer and the third semiconductor layer have a circular or elliptical shape in a plan view.

5. The light receiving device according to claim 2, wherein the first protruding portion and the second protruding portion are surrounded by the insulating material.

6. The light receiving device according to claim 5, wherein
    the insulating material has at least two different widths in a semiconductor substrate on which the light receiving device is formed in an in-plane direction, in the direction from the insulating material to the first electrode, and
    a first width of the insulating material at a first position where the insulating material is in contact with the second semiconductor layer is narrower than a second width of the insulating material at a second position where the insulating material is in contact with the first semiconductor layer.

7. The light receiving device according to claim 5, wherein a portion of the insulating material, which is in contact with the second semiconductor layer contains an insulating material containing impurities contained in the second semiconductor layer.

8. The light receiving device according to claim 5, wherein a semiconductor substrate on which the light receiving device is formed is formed with silicon, and an avalanche photo diode is formed on the semiconductor substrate.

9. A distance measuring apparatus comprising:
    a laser diode;
    a light receiving device; and
    a measuring circuit configured to compute a distance to a target based on electric signals generated by the light receiving device in response to light that is irradiated on the target by the laser diode, and reflected from the target and received by the light receiving device, wherein
    the light receiving device includes:
        a first electrode;
        a second electrode;

a protective layer between the first and second electrodes;
a first semiconductor layer of a first conductivity type between the protective layer and the first electrode, the first semiconductor layer having a first protruding portion and a second protruding portion;
an insulating material spaced from and between the first and second protruding portions and extending between the protective layer and the first semiconductor layer;
a second semiconductor layer of the first conductivity type between the first protruding portion and the protective layer and between the first protruding portion and the insulating material;
a third semiconductor layer of a second conductivity type between the second semiconductor layer and the protective layer and between the second semiconductor layer and the insulating material;
a fourth semiconductor layer of the first conductivity type between the second protruding portion and the protective layer and between the second protruding portion and the insulating material; and
a fifth semiconductor layer of the second conductivity type between the fourth semiconductor layer and the protective layer and between the fourth semiconductor layer and the insulating material.

10. The distance measuring apparatus according to claim 9, wherein the light receiving device further includes a resistor which is electrically connected to the second electrode.

11. The distance measuring apparatus according to claim 10, wherein the second semiconductor layer and the third semiconductor layer have a rectangular shape having rounded corners in a plan view.

12. The distance measuring apparatus according to claim 10, wherein the first protruding portion and the second protruding portion are surrounded by the insulating material.

13. The distance measuring apparatus according to claim 12, wherein
the insulating material has at least two different widths in a semiconductor substrate on which the light receiving device is formed in an in-plane direction, in the direction from the insulating material to the first electrode, and
a first width of the insulating material at a first position where the insulating material is in contact with the second semiconductor layer is narrower than a second width of the insulating material at a second position where the insulating material is in contact with the first semiconductor layer.

14. The distance measuring apparatus according to claim 12, wherein a portion of the insulating material, which is in contact with the second semiconductor layer contains an insulating material containing impurities contained in the second semiconductor layer.

15. The distance measuring apparatus according to claim 12, wherein a semiconductor substrate on which the light receiving device is formed is formed with silicon, and an avalanche photo diode is formed on the semiconductor substrate.

16. A method of measuring a distance to a target using a light receiving device including:
a first electrode;
a second electrode;
a protective layer between the first and second electrodes;
a first semiconductor layer of a first conductivity type between the protective layer and the first electrode, the first semiconductor layer having a first protruding portion and a second protruding portion;
an insulating material spaced from and between the first and second protruding portions and extending between the protective layer and the first semiconductor layer;
a second semiconductor layer of the first conductivity type between the first protruding portion and the protective layer and between the first protruding portion and the insulating material;
a third semiconductor layer of a second conductivity type between the second semiconductor layer and the protective layer and between the second semiconductor layer and the insulating material;
a fourth semiconductor layer of the first conductivity type between the second protruding portion and the protective layer and between the second protruding portion and the insulating material; and
a fifth semiconductor layer of the second conductivity type between the fourth semiconductor layer and the protective layer and between the fourth semiconductor layer and the insulating material, wherein said method comprising:
irradiating a laser light to the target;
generating electric signals in response to the laser light that is reflected from the target, received through the protective layer, and detected at an interface between the second and third semiconductor layers; and
computing the distance to the target based on the generated electric signals.

17. The method according to claim 16, wherein the light receiving device further includes a resistor which is electrically connected to the second electrode.

18. The method according to claim 16, wherein the first protruding portion and the second protruding portion are surrounded by the insulating material.

19. The method according to claim 16, wherein
the insulating material has at least two different widths in a semiconductor substrate on which the light receiving device is formed in an in-plane direction, in the direction from the insulating material to the first electrode, and
a first width of the insulating material at a first position where the insulating material is in contact with the second semiconductor layer is narrower than a second width of the insulating material at a second position where the insulating material is in contact with the first semiconductor layer.

20. The method according to claim 16, wherein a portion of the insulating material, which is in contact with the second semiconductor layer contains an insulating material containing impurities contained in the second semiconductor layer.

* * * * *